United States Patent
Matsumoto et al.

(10) Patent No.: US 7,679,390 B2
(45) Date of Patent: Mar. 16, 2010

(54) TEST APPARATUS AND PIN ELECTRONICS CARD

(75) Inventors: Naoki Matsumoto, Tokyo (JP); Takashi Sekino, Tokyo (JP)

(73) Assignee: Advantest Corporation (JP)

( * ) Notice: Subject to any disclaimer, the term of this patent is extended or adjusted under 35 U.S.C. 154(b) by 0 days.

(21) Appl. No.: 12/138,442

(22) Filed: Jun. 13, 2008

(65) Prior Publication Data

US 2008/0284448 A1 Nov. 20, 2008

Related U.S. Application Data

(63) Continuation of application No. PCT/JP2006/324848, filed on Dec. 13, 2006.

(30) Foreign Application Priority Data

Dec. 16, 2005 (JP) .............................. 2005-363384

(51) Int. Cl.
*G01R 31/02* (2006.01)
(52) U.S. Cl. ...................... 324/763; 324/537
(58) Field of Classification Search ................. 324/763, 324/537
See application file for complete search history.

(56) References Cited

U.S. PATENT DOCUMENTS

| 6,313,657 | B1 * | 11/2001 | Hashimoto | .................. 324/763 |
| 7,019,547 | B2 * | 3/2006 | Aghaeepour | ................ 324/765 |
| 2006/0123303 | A1 * | 6/2006 | Frame | ........................ 714/742 |

FOREIGN PATENT DOCUMENTS

| JP | 61044372 | 3/1986 |
| JP | 08110371 | 4/1996 |
| JP | 11064436 | 3/1999 |
| JP | 2001074816 | 3/2001 |
| JP | 2001264393 | 9/2001 |

* cited by examiner

*Primary Examiner*—Amy He
(74) *Attorney, Agent, or Firm*—Chen Yoshimura LLP

(57) ABSTRACT

Provided is a test apparatus that tests a DUT, which includes a driver that outputs a test signal to the DUT, a first transmission path that electrically connects the driver and the DUT, a first FET switch provided on the first transmission path to connect or disconnect the driver and the DUT to or from each other, and a capacitance compensator that detects an output signal from the DUT, and charges or discharges a capacitive component of the first FET switch based on the detected output signal.

14 Claims, 4 Drawing Sheets

TEST APPARATUS AND PIN ELECTRONICS CARD

CROSS REFERENCE TO RELATED APPLICATIONS

This is a continuation application of PCT/JP2006/324848 filed on Dec. 13, 2006 which claims priority from Japanese Patent Application No. 2005-363384 filed on Dec. 16, 2005, the contents of which are incorporated herein by reference.

BACKGROUND

1. Technical Field

The present invention relates to a test apparatus and a pin electronics card. More particularly, the present invention relates to a test apparatus that tests a device under test (DUT) such as a semiconductor circuit, and a pin electronics card for use in the test apparatus.

2. Related Art

Among test apparatuses that test DUTs such as semiconductor circuits, there is a known apparatus that includes a pin electronics card via which the apparatus exchanges signals with the DUT. The pin electronics card is provided between the main section of the test apparatus and the DUT to input a test signal from the test apparatus to the DUT and to receive an output signal from the DUT.

FIG. 4 shows an example configuration of a conventional pin electronics card 300. The pin electronics card 300 includes a driver 302, a comparator 304, an FET switch 312, a transmission path 314, and a reference voltage input section 316.

The driver 302 receives a test signal from the main section of the test apparatus and inputs it to a DUT. The driver 302 and the DUT are connected to each other via the FET switch 312 and the transmission path 314. The driver 302 includes a level selector switch 306, an enable switch 308, and an output resistor 310.

The comparator 304 receives an output signal from the DUT and compares the signal level of the output signal with a supplied reference voltage. The comparator 304 and the DUT are connected to each other via the FET switch 312 and the transmission path 314. The reference voltage input section 316 generates a predetermined reference voltage and inputs it to the comparator 304.

The FET switch 312 is switched on or off in response to a gate voltage given, and either connects the driver 302 and the comparator 304 to the DUT, or disconnects the driver 302 and the comparator 304 from the DUT. With this configuration, the main section of the test apparatus exchanges signals with the DUT. Presently, no relevant patent literature has been identified, so indication of any literature is provided.

The FET switch 312 in its ON state is represented by an equivalent circuit that includes: a resistor connected in series between the driver 302 and the DUT; and capacitive components between each terminal of the resistor and a ground potential. The equivalent circuit has a constant RC product, and cannot have both a low resistance and a low capacitance at the same time.

The FET switch 312 has a lower ON resistance when having a higher ON capacitance. In such a case, the FET switch 312 cannot allow a high-frequency signal to pass therethrough. Hence, tests using a high-frequency signal are impossible.

Therefore, for tests using a high-frequency signal to be possible, the ON resistance of the FET switch 312 may be increased. However, the comparator 304 is connected to the DUT via the FET switch 312. Hence, when the driver is enabled, the voltage comparison made by the comparator 304 is influenced by the ON resistance of the FET switch 312.

For example, the signal level of an output signal, which is to be input to the comparator 304, is voltage-divided between the output resistor 310 and the ON resistance of the FET switch 312. The larger the ON resistance of the FET switch 312 becomes, the larger the variation of the ON resistance becomes. Consequently, the voltage comparison accuracy of the comparator 304 is degraded.

Further, the ON resistance of the FET switch 312 changes in response to temperature, source-gate voltage, back-gate voltage, etc. Such changes are greater when the ON resistance of the FET switch 312 is larger. The voltage comparison accuracy of the comparator 304 would thus be further degraded.

SUMMARY

It is therefore an object of an aspect of the innovations herein to provide a test apparatus and a pin electronics card that can overcome the above drawback. The above object can be achieved by combinations described in the independent claims. The dependent claims define further advantageous and exemplary combinations of the present invention.

According to an exemplary test apparatus according to the first aspect of the innovations herein, provided is a test apparatus that tests a DUT, comprising: a driver that outputs a test signal to the DUT; a first transmission path that electrically connects the driver and the DUT; a first FET switch provided on the first transmission path to connect or disconnect the driver and the DUT to or from each other; and a capacitance compensator that detects an output signal from the DUT, and charges or discharges a capacitive component of the first FET switch based on the detected output signal.

According to an exemplary test apparatus according to the second aspect of the innovations herein, provided is a test apparatus that tests a DUT, comprising: a comparator that compares a voltage of an output signal from the DUT with a predetermined reference voltage; a second transmission path that electrically connects the DUT and the comparator; a second FET switch provided on the second transmission path to connect or disconnect the comparator and the DUT to or from each other; and a capacitance compensator that detects a test signal supplied to the DUT, and charges or discharges a capacitive component of the second FET switch based on the detected test signal.

According to an exemplary pin electronics card according to the third aspect of the innovations herein, provided is a pin electronics card in a test apparatus that exchanges signals with a DUT tested by the test apparatus, comprising: a driver that outputs a test signal to the DUT; a first transmission path that electrically connects the driver and the DUT; a first FET switch provided on the first transmission path to connect or disconnect the driver and the DUT to or from each other; and a capacitance compensator that detects an output signal from the DUT, and charges or discharges a capacitive component of the first FET switch based on the detected output signal.

According to an exemplary pin electronics card according to the fourth aspect of the innovations herein, provided is a pin electronics card in a test apparatus that exchanges signals with a DUT tested by the test apparatus, comprising: a comparator that compares a voltage of an output signal from the DUT with a predetermined reference voltage; a second transmission path that electrically connects the DUT and the comparator; a second FET switch provided on the second transmission path to connect or disconnect the comparator and the DUT to or from each other; and a capacitance compensator that detects a test signal supplied to the DUT, and charges or discharges a capacitive component of the second FET switch based on the detected test signal.

The summary clause does not necessarily describe all necessary features of the present invention. The present invention may also be a sub-combination of the features described above.

DESCRIPTION OF EXEMPLARY EMBODIMENTS

The present invention will now be described based on the embodiments, which do not intend to limit the scope of the claimed invention. All of the features and the combinations thereof described in the embodiment are not necessarily essential to the invention.

Figure 1:
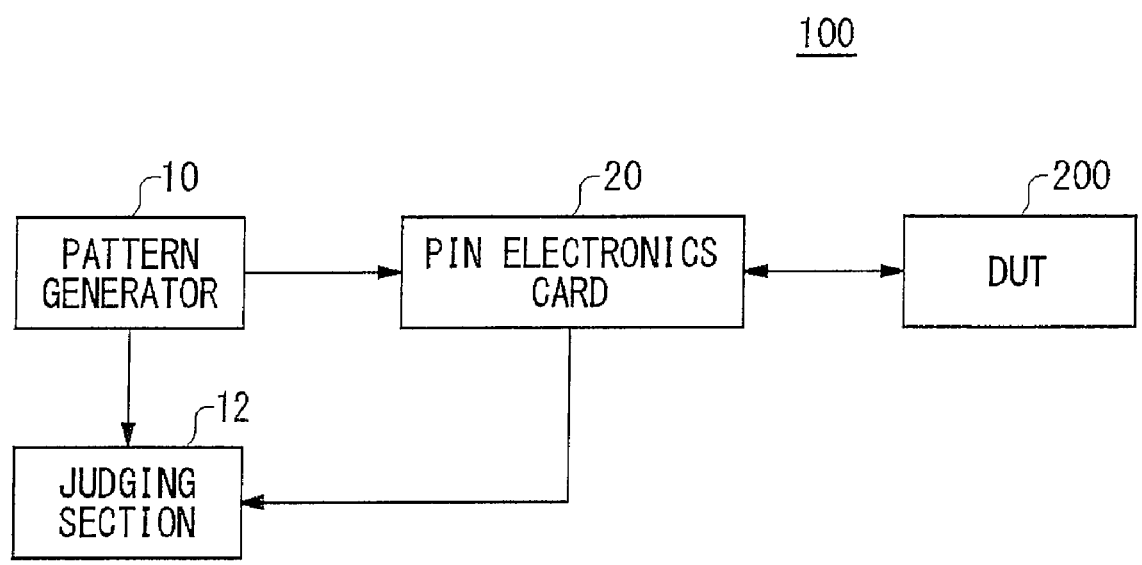
FIG. 1 shows an example configuration of a test apparatus 100 according to an embodiment of the present invention.

FIG. 1 shows an example configuration of a test apparatus 100 according to an embodiment of the present invention. The test apparatus 100 tests a DUT 200 such as a semiconductor circuit, and includes a pattern generator 10, a pin electronics card 20, and a judging section 12.

The pattern generator 10 generates a test pattern for testing the DUT 200, and inputs it to the pin electronics card 20. The pattern generator 10 also generates an expectation value signal, which the DUT 200 should ideally output, and inputs it to the judging section 12.

The pin electronics card 20 is provided between the pattern generator 10 and the DUT 200. The pin electronics card 20 inputs a test signal corresponding to the test pattern supplied by the pattern generator 10 to the DUT 200, and receives an output signal from the DUT 200.

The judging section 12 receives the output signal from the DUT 200 via the pin electronics card 20, and compares the output signal with the expectation value signal to judge whether the DUT 200 is defective or not.

Figure 2:
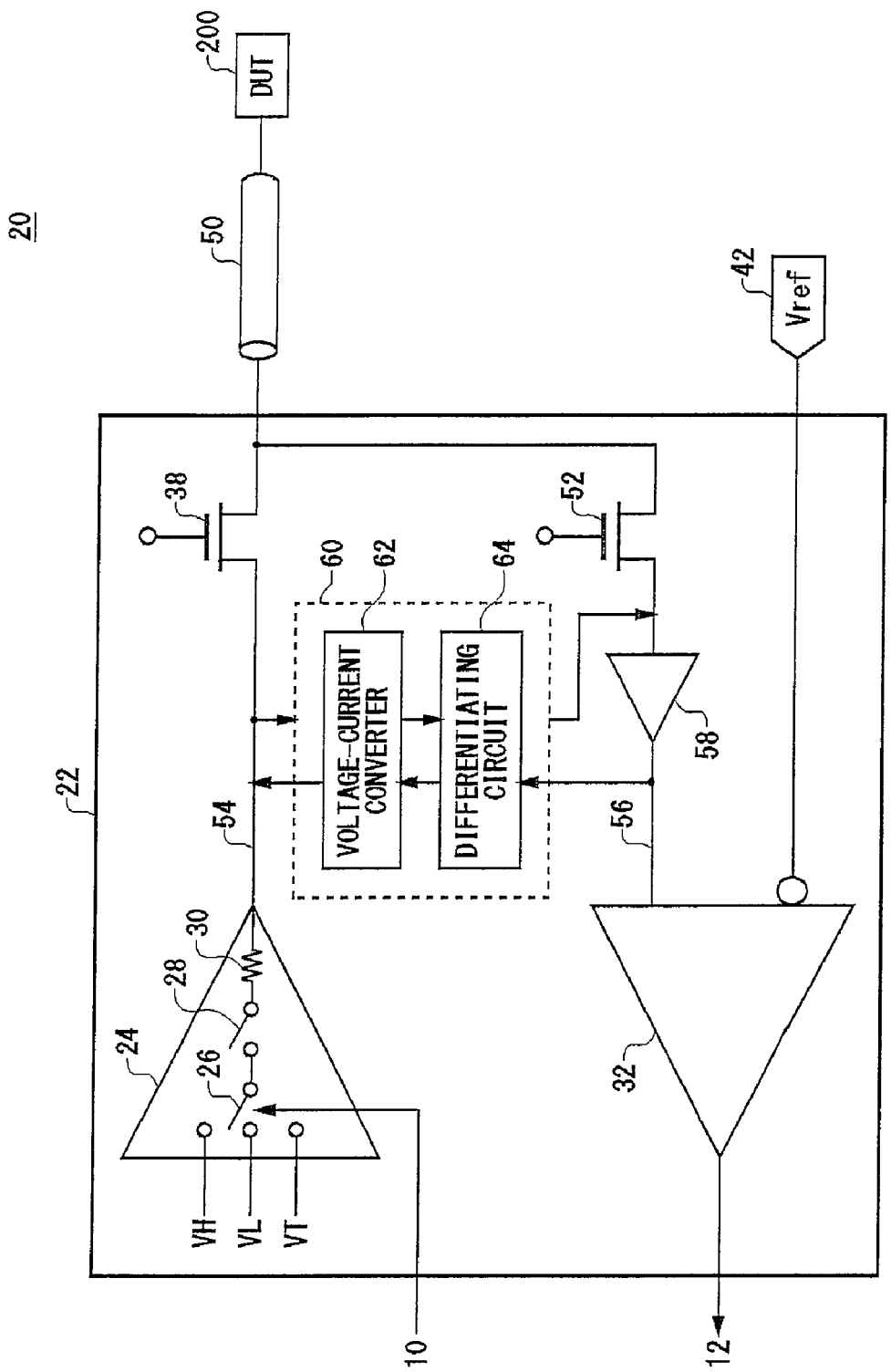
FIG. 2 shows an example configuration of a pin electronics card 20.

FIG. 2 shows an example configuration of the pin electronics card 20. The pin electronics card 20 includes a circuit board 22, a driver 24, a comparator 32, a first FET switch 38, a second FET switch 52, a first transmission path 54, a second transmission path 56, and a reference voltage input section 42. The circuit board 22 has at least the driver 24, the comparator 32, the first FET switch 38, and the second FET switch 52 provided thereon. In other words, the driver 24, the comparator 32, the first FET switch 38, and the second FET switch 52 are provided on the same circuit board 22.

The driver 24 receives a test pattern from the pattern generator 10, and outputs a test signal corresponding to the test pattern to the DUT 200. In the present example, the driver 24 includes a level selector switch 26, a first enable switch 28, and an output resistor 30.

The level selector switch 26 selects any of a plurality of voltages supplied. In the present example, the driver 24 is supplied with a high level voltage VH, a low level voltage VL, and a termination voltage VT. When the driver 24 is to output a test signal, the level selector switch 26 selects the high level voltage VH or the low level voltage VL. For example, by connecting the level selector switch 26 to the high level voltage VH or the low level voltage VL according to the test pattern, it is possible to generate a test signal waveform corresponding to the test pattern.

When an output signal is to be detected by the comparator 32, the level selector switch 26 is connected to the termination voltage VT. The first enable switch 28 may controllably terminate the output resistor 30 at the termination voltage VT or at a high impedance.

The first transmission path 54 electrically connects the driver 24 and the DUT 200. The first transmission path 54 may be provided between the driver 24 and a transmission path 50. For example, the transmission path 50 connects the pin electronics card 20 and the DUT 200.

The first FET switch 38 is provided on the first transmission path 54 to connect or disconnect the driver 24 and the DUT 200 to or from each other. The first FET switch 38 is, for example a field effect transistor, and switched on or off in response to a voltage supplied to its gate terminal. The test apparatus 100 may further include a controller that controls the gate voltage of the first FET switch 38.

The comparator 32 has two input terminals and compares the voltage levels of the signals input to these input terminals respectively. In the present example, the first input terminal receives an output signal from the DUT 200 via the second transmission path 56 and the second FET switch 52. The second input terminal receives a reference voltage from the reference voltage input section 42.

That is, the comparator 32 compares the voltage of the output signal with a predetermined reference voltage. For example, the comparator 32 outputs an H logic signal when the voltage level of the output signal is higher than the reference voltage, and outputs an L logic signal when the voltage level of the output signal is lower than the reference voltage. The judging section 12 compares the pattern of the signal output from the comparator 32 with an expectation value pattern supplied by the pattern generator 10.

The reference voltage input section 42 generates a predetermined reference voltage and inputs it to the comparator 32. The reference voltage input section 42 may be a digital-analog converter that outputs a voltage corresponding to a supplied digital value supplied.

The second transmission path 56 branches out from a portion of the first transmission path 54 that is between the first FET switch 38 and the DUT 200 to connect the first transmission path 54 to the comparator 32. The second FET switch 52 is provided on the second transmission path 56 to connect or disconnect the comparator 32 and the DUT 200 to or from each other.

The second FET switch 52 is, for example, a field effect transistor, and is switched on or off in response to a voltage supplied to its gate terminal. The test apparatus 100 may further include a controller that controls the gate voltage of the first FET switch 38. Such a controller may control the first FET switch 38 and the second FET switch 52 to be switched on or off at substantially the same time.

In the pin electronics card 20 according to the present example, the connection between the first transmission path 54 and the second transmission path 56 is between the first FET switch 38 and the DUT 200. Hence, an output signal to be input to the comparator 32 is not voltage-divided between the first FET switch 38 and the output resistor 30. Accordingly, if the ON resistance of the first FET switch 38 is increased so that a high-frequency signal can be transmitted, but the ON resistance consequently fluctuates, the comparator 32 will not be influenced by the fluctuation of the ON resistance and can perform voltage comparison accurately. Hence, a high accuracy test can be performed even when the ON resistance of the first FET switch 38 is increased so that a high-frequency signal can be transmitted. Further, since the second FET switch 52 is provided on the second transmission path 56, the comparator 32 can be isolated from the external DUT 200 or the like.

When an output signal from the DUT 200 is to be detected by the comparator 32, the signal might be reflected by the first FET switch 38. To be more specific, if a current corresponding to the output signal from the DUT 200 flows into the capacitive component of the first FET switch 38, reflection might occur from the first FET switch 38.

To mitigate this, the pin electronics card 20 according to the present example further includes a capacitance compensator 60 and a buffer amplifier 58. The capacitance compensator 60 detects an output signal from the DUT 200, and charges or discharges the capacitive component of the first FET switch 38 based on the detected output signal. The buffer amplifier 58 is provided on a portion of the second transmission path 56 between the second FET switch 52 and the comparator 32, and inputs a signal that has passed through the second FET switch 52 into the comparator 32.

The capacitance compensator 60 includes a detecting means that detects the output signal at the portion of the second transmission path 56 between the second FET switch 52 and the comparator 32. The capacitance compensator 60, according to the present example, detects the output signal at a portion of the second transmission path 56 between the buffer amplifier 58 and the comparator 32. The capacitance compensator 60 further includes a current applying means that applies a current according to the output signal to a portion of the first transmission path 54 between the driver 24 and the first FET switch 38.

This configuration allows the current according to the output signal to be supplied to the first FET switch 38 from the driver 24 side, making the capacitive component of the first FET switch 38 small when viewed from the DUT 200. This can reduce the signal reflection at the first FET switch 38.

In the present example, the capacitance compensator 60 includes a differentiating circuit 64 and a voltage-current converter 62. The differentiating circuit 64 may function as the detecting means described above, and the voltage-current converter 62 may function as the current applying means described above.

The differentiating circuit 64 generates a differential waveform of the detected output signal. In the present example, the differentiating circuit 64 differentiates the voltage waveform of the output signal and generates a differential waveform. The voltage-current converter 62 generates a current according to the differential waveform generated by the differentiating circuit 64, and supplies it to the capacitive component of the first FET switch 38. For example, the voltage-current converter 62 supplies, to the capacitive component of the first FET switch 38, a current having a waveform similar to the differential waveform. The capacitance compensator 60 may further include a controller that controls the gain of the voltage-current conversion by the voltage-current converter 62. It is preferred that the gain of the voltage-current conversion be preliminarily calibrated such that the first FET switch 38 causes minimal reflection.

With this configuration, the voltage-current converter 62 generates a current to charge the capacitive component of the first FET switch 38 in response to a rising edge of the output signal. The voltage-current converter 62 generates a current to discharge from the capacitive component of the first FET switch 38 in response to a falling edge of the output signal. This makes it possible to reduce the reflection of the output signal at the first FET switch 38.

Further, in the present example, the voltage-current converter 62 generates the current to charge or discharge the capacitive component of the first FET switch 38. In another example, the driver 24 may generate this current. In this case, the capacitance compensator 60 would control the driver 24 according to the detected output signal and make the driver 24 generate this current.

The reflection of the output signal from the DUT 200 at the first FET switch 38 has been explained above. By the same token, a test signal output from the driver 24 might be reflected at the second FET switch 52. In such a case, the capacitance compensator 60 may detect the test signal and charge or discharge the capacitive component of the second FET switch 52 based on the detected test signal.

In this case, the capacitance compensator 60 detects the test signal at a portion of the first transmission path 54 between the driver 24 and the first FET switch 38. The differentiating circuit 64 may detect the test signal. The capacitance compensator 60 supplies a current to charge or discharge the capacitive component of the second FET switch 52 to a portion of the second transmission path 56 between the comparator 32 and the second FET switch 52. The capacitance compensator 60 according to the present example supplies the current to charge or discharge the capacitive component of the second FET switch 52 to a portion of the second transmission path 56 between the buffer amplifier 58 and the second FET switch 52. The voltage-current converter 62 may generate this current.

When charging or discharging the capacitive component of the second FET switch 52 based on the test signal, the differentiating circuit 64 and the voltage-current converter 62 function and operate the same way as when charging or discharging the capacitive component of the first FET switch 38 based on the output signal.

With this configuration, the voltage-current converter 62 generates the current to charge the capacitive component of the second FET switch 52 in response to a rising edge of the test signal. The voltage-current converter 62 generates the current to discharge from the capacitive component of the second FET switch 52 in response to a falling edge of the test signal. This makes it possible to reduce the reflection of the test signal at the second FET switch 52.

Figure 3:
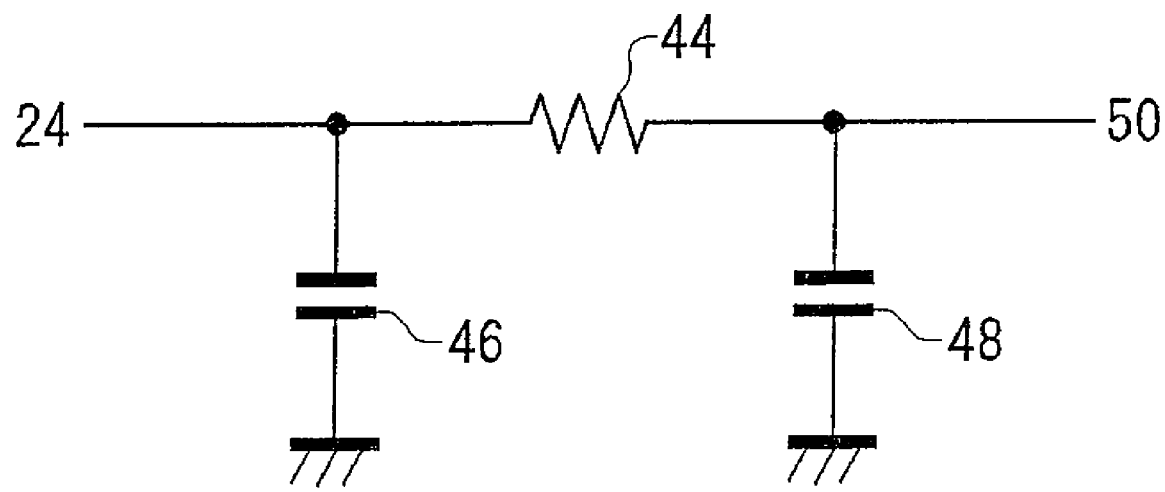
FIG. 3 shows an example equivalent circuit of a first FET switch 38 in its ON state.
Figure 4:
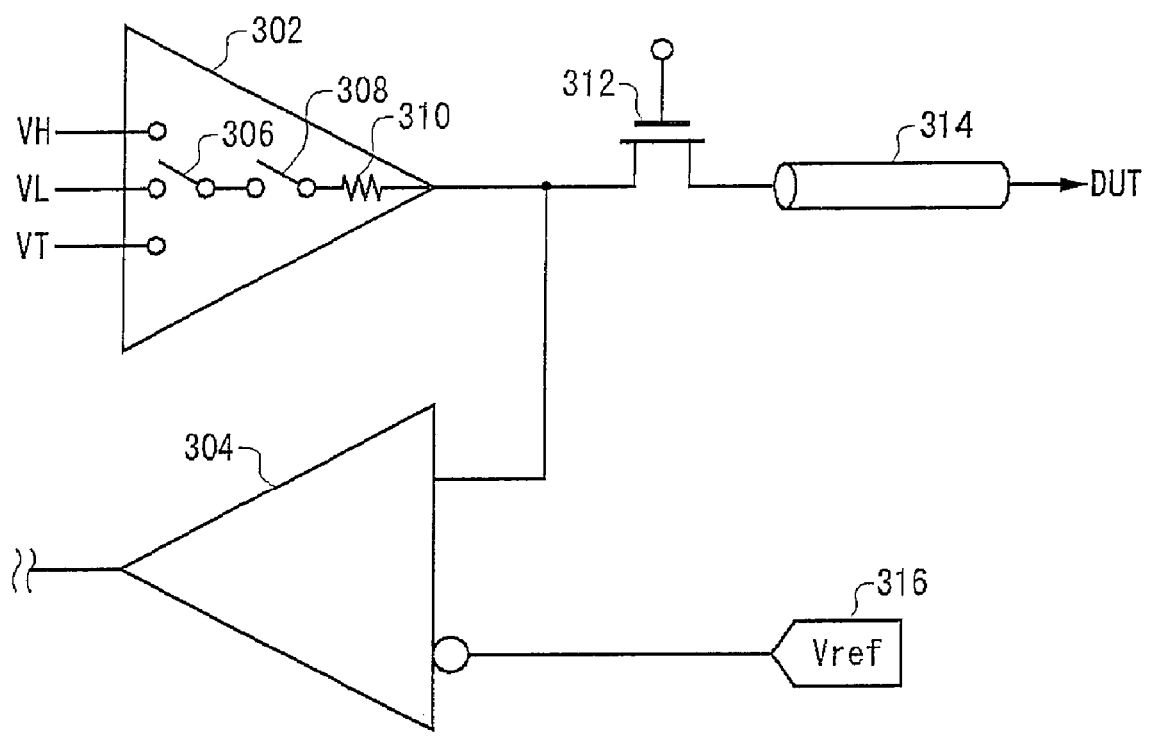
FIG. 4 shows an example configuration of a conventional pin electronics card 300.

FIG. 3 shows an example equivalent circuit of the first FET switch 38 in its ON state. The first FET switch 38 in the ON state is represented by a resistor 44, a capacitive component 46, and another capacitive component 48. The resistor 44 is connected in series between the driver 24 and the transmission path 50. The capacitive component 46 and the capacitive component 48 are connected between either end of the resistor 44 and the ground potential.

In this equivalent circuit, the product of the resistance value and the capacitance value is constant. That is, in the first FET switch 38, the ON resistance and the capacitive component are inversely proportional. The first FET switch 38 is on the path through which the test signal to be input to the DUT 200 from the driver 24 is transmitted. Hence, it is preferred that the value of the ON resistance of the first FET switch 38 be determined according to the frequency of the test signal to be transmitted.

The first FET switch 38 and the second FET switch 52 are connected in parallel between the driver 24 and the DUT 200. Accordingly, the capacitance is larger than in a conventional test apparatus that uses a single FET switch. However, no current flows across the DUT 200 and the comparator 32. Thus, the ON resistance of the second FET switch 52 may be high as long as the capacitance can be sufficiently small. This makes it possible to suppress the increase in the capacitance.

Although the present invention has been described by way of exemplary embodiments, the technical scope of the present invention is not limited to the scope of disclosure of the above embodiments. It is apparent to those skilled in the art that various modifications or alterations can be made upon the above embodiments. It is clear from the claims that embodiments including such modifications or alterations can also be included in the technical scope of the present invention.

As obvious from the above, according to an embodiment of the present invention, by providing FET switches to both the driver and the comparator, it is possible to prevent degradation of the voltage comparison accuracy of the comparator due to any fluctuation of the ON resistance of the FET switches. Furthermore, it is possible to reduce signal reflection at the FET switches.

What is claimed is:

1. A test apparatus that tests a DUT, comprising:
    a driver that outputs a test signal to the DUT;
    a first transmission path that electrically connects the driver and the DUT;
    a first FET switch provided on the first transmission path to connect or disconnect the driver and the DUT to or from each other;
    a capacitance compensator that detects an output signal from the DUT, and charges or discharges a capacitive component of the first FET switch based on the detected output signal; and
    a second transmission path that branches out from a portion of the first transmission path that is between the first FET switch and the DUT, the second transmission path connecting the first transmission path and the capacitance compensator.

2. The test apparatus according to claim 1, further comprising:
    a comparator that compares a voltage of the output signal with a predetermined reference voltage; and
    a second FET switch provided on the second transmission path to connect or disconnect the comparator and the DUT to or from each other,
    wherein the second transmission path connects the first transmission path and the comparator.

3. The test apparatus according to claim 2,
    wherein the capacitance compensator includes:
        a detector that detects the output signal at a portion of the second transmission path that is between the second FET switch and the comparator; and
        a current applying section that applies a current based on the output signal detected by the detector to a portion of the first transmission path that is between the driver and the first FET switch.

4. The test apparatus according to claim 3,
    wherein the driver, the comparator, the first FET switch, and the second FET switch are provided on a same circuit board.

5. The test apparatus according to claim 3,
    wherein the current applying section generates a current to charge the capacitive component of the first FET switch in response to a rising edge of the output signal, and generates a current to discharge from the capacitive component of the first FET switch in response to a falling edge of the output signal.

6. The test apparatus according to claim 5,
    wherein the detector includes a differentiating circuit that generates a differential waveform of the output signal, and
    the current applying section includes a voltage-current converter that generates a current according to the differential waveform.

7. The test apparatus according to claim 3, further comprising a buffer amplifier provided at the portion of the second transmission path that is between the second FET switch and the comparator,
    wherein the detector detects the output signal at a portion of the second transmission path that is between the buffer amplifier and the comparator.

8. The test apparatus according to claim 4,
    wherein an ON resistance of the second FET switch is larger than an ON resistance of the first FET switch.

9. A test apparatus that tests a DUT, comprising:
    a comparator that compares a voltage of an output signal from the DUT with a predetermined reference voltage;
    a first transmission path;
    a second transmission path that electrically connects the DUT and the comparator;
    a second FET switch provided on the second transmission path to connect or disconnect the comparator and the DUT to or from each other; and
    a capacitance compensator that detects a test signal supplied to the DUT, and charges or discharges a capacitive component of the second FET switch based on the detected test signal,
    wherein the first transmission path branches out from a portion of the second transmission path that is between the second FET switch and the DUT, the first transmission path connecting the second transmission path and the capacitance compensator.

10. The test apparatus according to claim 9, further comprising:
    a driver that outputs a test signal to the DUT; and
    a first FET switch provided on the first transmission path to connect or disconnect the driver and the DUT to or from each other,
    wherein the first transmission path electrically connects the driver and the DUT.

11. A pin electronics card in a test apparatus that exchanges signals with a DUT tested by the test apparatus, comprising:
    a driver that outputs a test signal to the DUT;
    a first transmission path that electrically connects the driver and the DUT;
    a first FET switch provided on the first transmission path to connect or disconnect the driver and the DUT to or from each other;
    a capacitance compensator that detects an output signal from the DUT, and charges or discharges a capacitive component of the first FET switch based on the detected output signal; and
    a second transmission path that branches out from a portion of the first transmission path that is between the first FET switch and the DUT, the second transmission path connecting the first transmission path and the capacitance compensator.

12. The pin electronics card according to claim 11, further comprising:
    a comparator that compares a voltage of the output signal with a predetermined reference voltage; and
    a second FET switch provided on the second transmission path to connect or disconnect the comparator and the DUT to or from each other,
    wherein the second transmission path connects the first transmission path and the comparator.

13. A pin electronics card in a test apparatus that exchanges signals with a DUT tested by the test apparatus, comprising:

a comparator that compares a voltage of an output signal from the DUT with a predetermined reference voltage;
a first transmission path;
a second transmission path that electrically connects the DUT and the comparator;
a second FET switch provided on the second transmission path to connect or disconnect the comparator and the DUT to or from each other; and
a capacitance compensator that detects a test signal supplied to the DUT, and charges or discharges a capacitive component of the second FET switch based on the detected test signal,
wherein the first transmission path branches out from a portion of the second transmission path that is between the second FET switch and the DUT, the first transmission path connecting the second transmission path and the capacitance compensator.

14. The pin electronics card according to claim 13, further comprising:
a driver that outputs a test signal to the DUT; and
a first FET switch provided on the first transmission path to connect or disconnect the driver and the DUT to or from each other,
wherein the first transmission path electrically connects the driver and the DUT.

* * * * *